(12) United States Patent
Chiu

(10) Patent No.: US 11,914,491 B2
(45) Date of Patent: Feb. 27, 2024

(54) USB INTEGRATED CIRCUIT, TESTING PLATFORM AND OPERATING METHOD FOR USB INTEGRATED CIRCUIT

(71) Applicant: VIA LABS, INC., New Taipei (TW)

(72) Inventor: Hao-Hsuan Chiu, New Taipei (TW)

(73) Assignee: VIA LABS, INC., New Taipei (TW)

( * ) Notice: Subject to any disclaimer, the term of this patent is extended or adjusted under 35 U.S.C. 154(b) by 0 days.

(21) Appl. No.: 17/985,920

(22) Filed: Nov. 14, 2022

(65) Prior Publication Data

US 2023/0176954 A1 Jun. 8, 2023

Related U.S. Application Data

(60) Provisional application No. 63/287,088, filed on Dec. 8, 2021.

(30) Foreign Application Priority Data

Aug. 5, 2022 (TW) .................................. 111129477

(51) Int. Cl.
*G06F 11/22* (2006.01)
*G01R 1/04* (2006.01)
*G06F 11/273* (2006.01)

(52) U.S. Cl.
CPC ........ *G06F 11/2273* (2013.01); *G01R 1/0416* (2013.01); *G06F 11/221* (2013.01); *G06F 11/2733* (2013.01); *G06F 2213/0042* (2013.01)

(58) Field of Classification Search
CPC ............... G06F 11/2733; G06F 11/221; G06F 2213/0042; G01R 1/0416; G01R 31/2851
See application file for complete search history.

(56) References Cited

U.S. PATENT DOCUMENTS 6,654,913 B1 * 11/2003 Minikel ................ G06F 11/221
714/E11.161
6,829,726 B1 * 12/2004 Korhonen ............. G06F 11/221
714/25

(Continued)

FOREIGN PATENT DOCUMENTS

| CN | 208873140 | 5/2019 |
| TW | 201947399 | 12/2019 |
| TW | 202107283 | 2/2021 |

OTHER PUBLICATIONS

"Office Action of Taiwan Counterpart Application", dated Oct. 27, 2023, p. 1-p. 4.

*Primary Examiner* — Yolanda L Wilson
(74) *Attorney, Agent, or Firm* — JCIPRNET

(57) ABSTRACT

A USB integrated circuit (IC), a testing platform and an operating method for USB integrated circuit are provided. The USB integrated circuit includes a USB port physical layer (PHY) circuit, a first lane adapter, a second lane adapter, a routing circuit, and a USB transport layer circuit. The USB PHY circuit is configured to transmit a differential signal between the USB integrated circuit and an outside device. When the USB integrated circuit operates in a testing mode, the routing circuit electrically connects the first lane adapter to the USB PHY circuit. When the USB integrated circuit operates in a working mode, the routing circuit electrically connects the second lane adapter to the USB PHY circuit. The USB transport layer circuit is coupled to the first lane adapter and the second lane adapter.

21 Claims, 6 Drawing Sheets

(56) References Cited

U.S. PATENT DOCUMENTS

2012/0317446 A1* 12/2012 Jaramillo .............. G06F 11/221
                                                               714/43
2018/0336160 A1* 11/2018 Fukumoto ........... G06F 13/4068
2019/0114242 A1*  4/2019 Su ........................ G06F 11/273
2019/0317774 A1  10/2019 Raghav et al.

* cited by examiner

USB INTEGRATED CIRCUIT, TESTING PLATFORM AND OPERATING METHOD FOR USB INTEGRATED CIRCUIT

CROSS-REFERENCE TO RELATED APPLICATION

This application claims the priority benefit of U.S. provisional application Ser. No. 63/287,088, filed on Dec. 8, 2021 and Taiwan application serial no. 111129477, filed on Aug. 5, 2022. The entirety of each of the above-mentioned patent applications is hereby incorporated by reference herein and made a part of this specification.

BACKGROUND

Technical Field

The disclosure relates to an electronic circuit, and in particular relates to a universal serial bus (hereinafter USB) integrated circuit, a testing platform, and an operating method for a USB integrated circuit.

Description of Related Art

USB is a standard for connecting computer systems and outside devices. USB is divided into various specifications according to the transmission speed and connection method. For the USB4 V2 Gen4 specification, the signal is encoded by pulse-amplitude modulation (PAM).

On the other hand, in the research and development stage of the electronic device, the electronic device to which the USB4 V2 Gen4 specification is applied may be tested through a programmable logic device (PLD). However, the current programmable logic devices may support limited transmission standards and cannot execute tests on signals conforming to the USB4 V2 Gen4 specification.

It should be noted that the content of the "BACKGROUND" section is used to help understand the disclosure. Some of the content (or all of the content) disclosed in the "BACKGROUND" section may not be known by those of ordinary skill in the art. The content disclosed in the "BACKGROUND" section does not mean that the content has been known to those with ordinary knowledge in the technical field before the application of the disclosure.

SUMMARY

Embodiments of the disclosure provide a USB integrated circuit capable of executing a test on a device to be tested to which the USB4 V2 Gen4 specification is applied.

The USB integrated circuit of the embodiment of the disclosure includes a first USB port physical layer circuit, a first lane adapter, a second lane adapter, a routing circuit, and a USB transport layer circuit. The first USB port physical layer circuit is configured to transmit a differential signal between the USB integrated circuit and an outside device. The routing circuit is coupled to the first USB port physical layer circuit, the first lane adapter, and the second lane adapter. When the USB integrated circuit operates in a testing mode, the routing circuit electrically connects the first lane adapter to the first USB port physical layer circuit. When the USB integrated circuit operates in a working mode, the routing circuit electrically connects the second lane adapter to the first USB port physical layer circuit. The USB transport layer circuit is coupled to the first lane adapter and the second lane adapter.

The embodiment of the disclosure also provides a testing platform. The testing platform is configured to test a USB integrated circuit to be tested. The testing platform includes a testing machine and a USB integrated circuit. The testing machine is configured to generate a test pattern. The USB integrated circuit is coupled to the testing machine to receive a first downstream signal conforming to USB4 V2 specification. The first downstream signal includes the test pattern. The USB integrated circuit is further coupled to the USB integrated circuit to be tested to provide a second downstream signal conforming to USB4 V1 specification. The test pattern generated by the testing machine is transmitted to the USB integrated circuit to be tested through the USB integrated circuit. The USB integrated circuit includes a first USB port physical layer circuit, a first lane adapter, a routing circuit, and a USB transport layer circuit. The first USB port physical layer circuit is configured to transmit a differential signal between the USB integrated circuit and the testing machine. The routing circuit is coupled to the first USB port physical layer circuit and the first lane adapter. When the USB integrated circuit operates in a testing mode, the routing circuit electrically connects the first lane adapter to the first USB port physical layer circuit. The USB transport layer circuit is coupled to the first lane adapter.

The embodiment of the disclosure also provide an operating method for a USB integrated circuit. The operating method of the USB integrated circuit includes the following operations. A differential signal is transmitted between the USB integrated circuit and an outside device through a first USB port physical layer circuit of the USB integrated circuit. When the USB integrated circuit operates in a testing mode, a first lane adapter of the USB integrated circuit is electrically connected to the first USB port physical layer circuit through a routing circuit of the USB integrated circuit. The routing circuit is coupled to the first USB port physical layer circuit and the first lane adapter, and a USB transport layer circuit of the USB integrated circuit is coupled to the first lane adapter. When the USB integrated circuit operates in a working mode, a second lane adapter of the USB integrated circuit is electrically connected to the first USB port physical layer circuit through the routing circuit. The routing circuit and the USB transport layer circuit are coupled to the second lane adapter.

Based on the above, the USB integrated circuit, the testing platform, and the operating method of the USB integrated circuit according to the embodiments of the disclosure may transmit application-specific data conforming to the USB4 V2 Gen4 specification through the USB port physical layer circuit and the lane adapter to execute a test on the USB integrated circuit to be tested.

In order to make the above-mentioned features and advantages of the disclosure comprehensible, embodiments accompanied with drawings are described in detail below.

DETAILED DESCRIPTION OF DISCLOSED EMBODIMENTS

A portion of the embodiments of the disclosure will be described in detail with reference to the accompanying drawings. Element symbol referenced in the following description will be regarded as the same or similar element when the same element symbol appears in different drawings. These examples are only a portion of the disclosure and do not disclose all possible embodiments of the disclosure. More precisely, these embodiments are only examples within the scope of the patent application of the disclosure.

Figure 1:
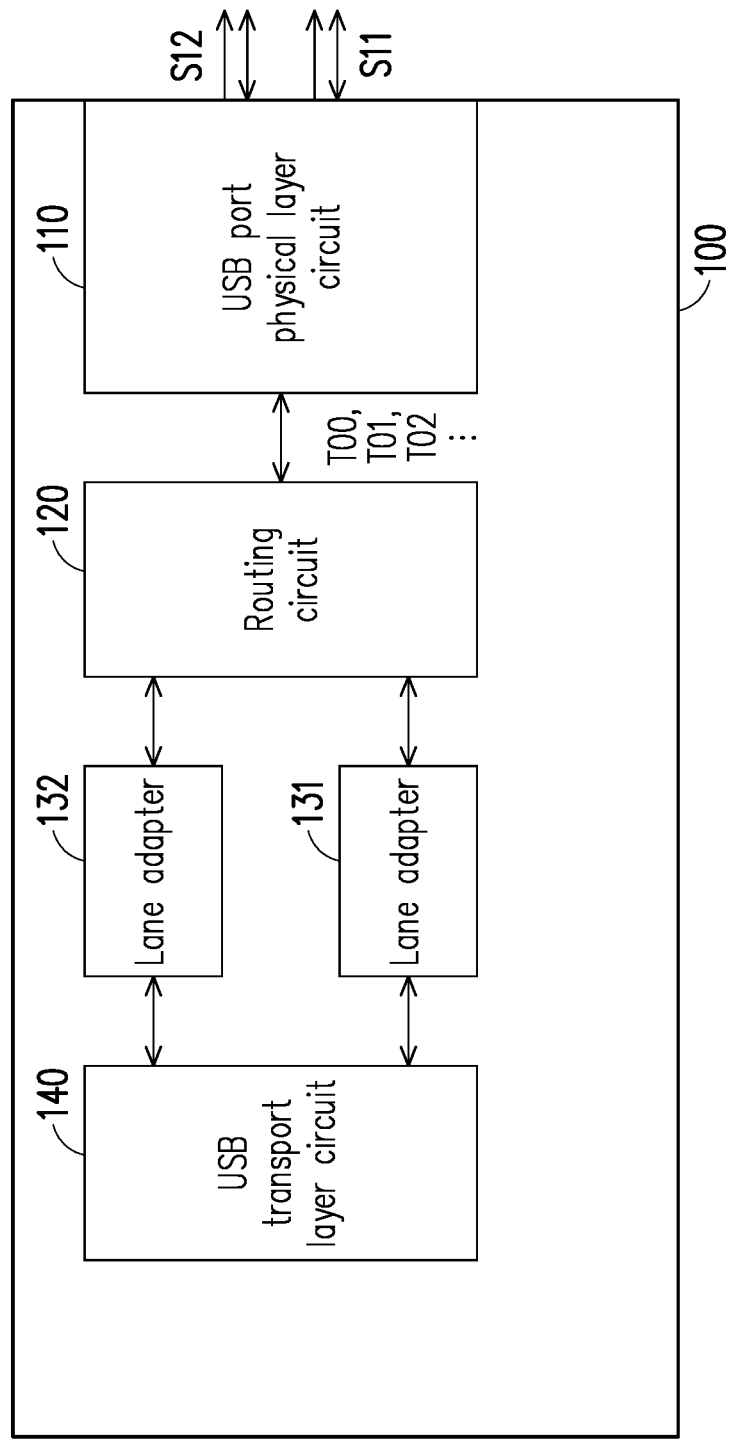
FIG. 1 is a circuit block diagram of a USB integrated circuit according to an embodiment of the disclosure.

FIG. 1 is a circuit block diagram of a USB integrated circuit according to an embodiment of the disclosure. In some embodiments, a USB integrated circuit 100 may be applied in an upstream-facing port (UFP) circuit of a USB hub to connect to a USB host. In still other embodiments, the USB integrated circuit 100 may be applied in a UFP circuit of a USB device to connect to a USB host or a USB hub. In other embodiments, the USB integrated circuit 100 may be used in a downstream-facing port (DFP) circuit of a USB host to connect to a USB device or a USB hub. In still other embodiments, the USB integrated circuit 100 may be used in a DFP circuit of a USB hub to connect a USB device. Alternatively, in some embodiments, the USB integrated circuit 100 may be applied in a testing platform to execute testing in cooperation with a programmable logic device (PLD). In some embodiments, the USB integrated circuit 100 may also be applied in other electronic devices to independently execute testing and/or other operations.

In the embodiment shown in FIG. 1, the USB integrated circuit 100 includes a USB port physical layer circuit 110, a routing circuit 120, lane adapters 131 to 132, and a USB transport layer circuit 140. The routing circuit 120 is coupled to the USB port physical layer circuit 110. The routing circuit 120 is also coupled to the lane adapters 131 and 132. The lane adapter 131 is coupled to one of the multiple transmission ends of the USB transport layer circuit 140. The lane adapter 132 is coupled to another one of the multiple transmission ends of the USB transport layer circuit 140.

In this embodiment, the USB port physical layer circuit 110 is a port physical layer circuit conforming to the USB4 V2 specification. The USB4 V2 specification includes the USB4 V2 Gen2 specification, the USB4 V2 Gen3 specification, and the USB4 V2 Gen4 specification. In this embodiment, the USB port physical layer circuit 110 is adapted to be coupled to an outside device (not shown in FIG. 1) through a USB connector. According to the actual design, the USB connector (not shown in FIG. 1) may be a USB Type-C (also known as USB-C) connector. The USB port physical layer circuit 110 may be compatible with outside devices of other USB specifications earlier than the USB4 V2 specification. The aforementioned other USB specifications (hereinafter referred to as compatible USB specifications) are, for example, the USB4 V1 specification and the USB3 specification, in which the USB3 specification includes the USB3 Gen1 specification and the USB3 Gen2 specification.

In this embodiment, the lane adapter 131 is a "vendor specific adapter" conforming to the USB4 V2 specification. The lane adapter 131 may process the transmission of application specific data between the routing circuit 120 and the USB transport layer circuit 140 to implement a specific application (e.g., to execute tests) required by the manufacturer. Application specific data conforms to the USB4 V2 specification or a compatible USB specification.

In this embodiment, the lane adapter 132 is a lane adapter conforming to the USB4 V2 specification. The lane adapter 132 may be a standard specification adapter to process data conforming to the USB4 V2 specification or a compatible USB specification transmitted between the routing circuit 120 and the USB transport layer circuit 140.

Figure 2:
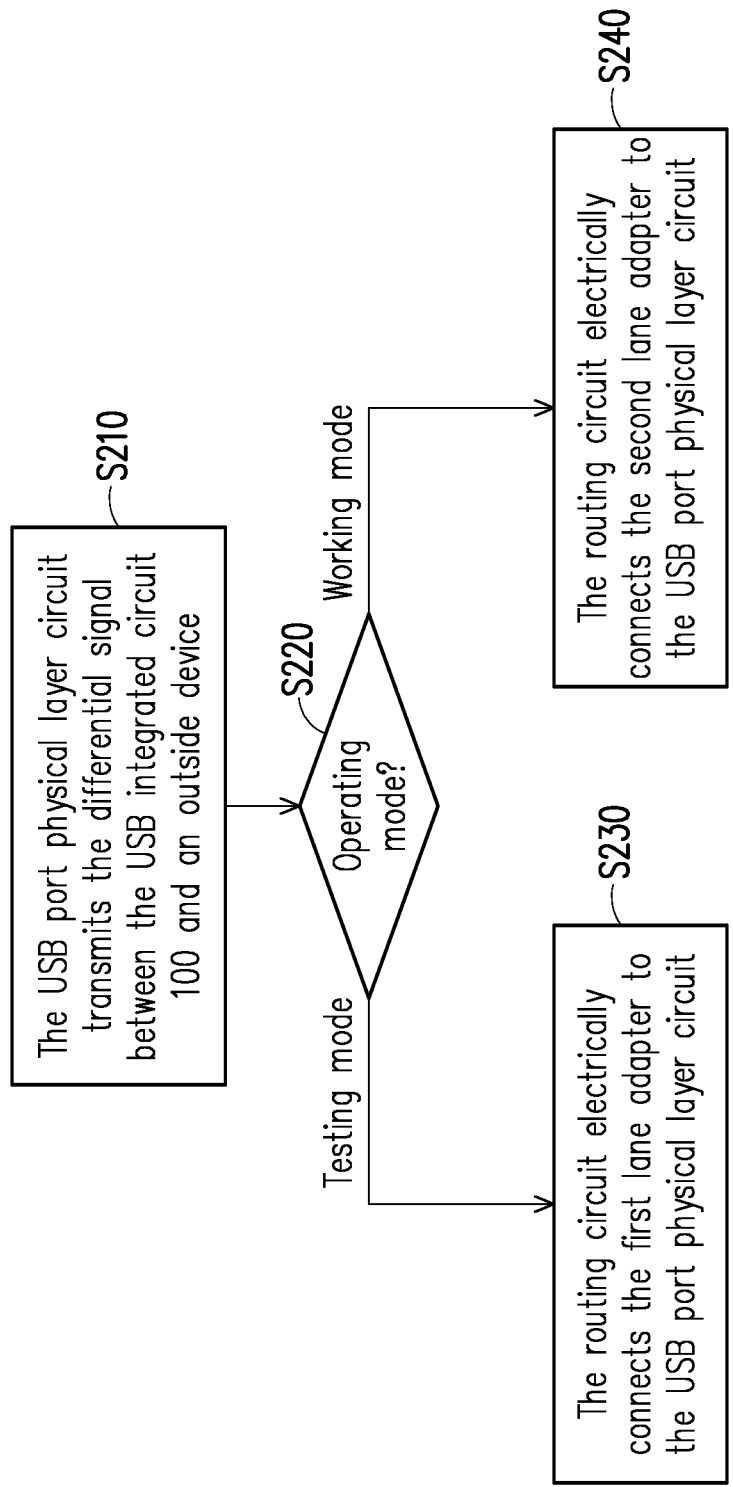
FIG. 2 is a schematic flowchart of an operating method of a USB integrated circuit according to an embodiment of the disclosure.

FIG. 2 is a schematic flowchart of an operating method of a USB integrated circuit according to an embodiment of the disclosure. The operating method shown in FIG. 2 is applicable to the USB integrated circuit 100 shown in FIG. 1. The operating method shown in FIG. 2 is described in detail below with reference to various elements of the embodiment of FIG. 1. The related description of the operating method shown in FIG. 2 may also be applied to a USB integrated circuit 300 shown in FIG. 3, the USB integrated circuits 400_1 to 400_2 shown in FIG. 4, and/or the USB integrated circuit 500 in the testing platform 50 shown in FIG. 5 by analogy.

Referring to FIG. 1 and FIG. 2, in step S210, the USB port physical layer circuit 110 may transmit the differential signals S11 to S12 between the USB integrated circuit 100 and an outside device (not shown in FIG. 1). In this embodiment, the differential signals S11 to S12 may be pulse-amplitude modulation (PAM) signals conforming to the USB4 V2 specification. In some embodiments, the differential signals S11 to S12 conform to compatible USB specifications.

For example, the differential signals S11 and S12 may be three-level PAM signals (i.e., PAM3 signals) conforming to the USB4 V2 specification. The PAM3 signal at each time point may assume any one of three signal states. Compared with the non-return-to-zero (NRZ) signal with two level states (such as 0 or 1), the differential signal S11 (S12) belonging to the PAM3 signal requires 1.5 bits to represent the raw data at a single time point.

In this embodiment, the USB port physical layer circuit 110 may convert the differential signal S11 into ternary digital signals T00, T01, T02, . . . . Specifically, the USB port physical layer circuit 110 may format the differential signal S11 to convert the differential signal S11 from an analog signal (PAM3 signal) to a digital signal (ternary signal). The differential signal S12 may be deduced by referring to the related description of the differential signal S11, and therefore is not repeated herein.

In this embodiment, the USB integrated circuit 100 may selectively operate in a testing mode or a working mode. Specifically, the routing circuit 120 is controlled by a processor (not shown in FIG. 1) of the USB integrated circuit 100 to switch the operating mode of the USB integrated circuit 100.

When the USB integrated circuit 100 operates in the testing mode (the determination result of step S220 is "testing mode"), the USB integrated circuit 100 may perform step S230. In step S230, the routing circuit 120 may electrically connect the lane adapter 131 to the USB port physical layer circuit 110. At this time, the routing circuit 120 may transmit the ternary digital signals T00, T01, T02, . . . between the lane adapter 131 and the USB port physical layer circuit 110. In this embodiment, the USB integrated circuit 100 operating in the testing mode may execute at least one function. For example, when the USB integrated circuit 100 operates in the testing mode, the testing machine (USB host or testing mode determination device) connected to the USB integrated circuit 100 or the USB integrated circuit 100 may test the device to be tested coupled to the USB integrated circuit 100 to determine whether the function of the device to be tested is abnormal.

For example, in some embodiments, in the analog test of the testing mode, the testing mode determination device may determine whether the differential signal S11 or/and S12 of the device to be tested conforms to the required transmission specification (e.g., USB4 V2 Gen4 specification) according to the differential signal S11 or/and S12 (e.g., PAM3 signal) transmitted between the device to be tested and the USB port physical layer circuit 110. In some embodiments, in the logic test of the testing mode, the testing mode determination device may determine whether the device to be tested may operate normally according to the ternary digital signals T00, T01, T02, . . . sent back from the device to be tested.

When the USB integrated circuit 100 operates in the working mode (the determination result of step S220 is "working mode"), the USB integrated circuit 100 may perform step S240. In step S240, the routing circuit 120 may electrically connect the lane adapter 132 to the USB port physical layer circuit 110. At this time, the routing circuit 120 may transmit the ternary digital signals T00, T01, T02, . . . between the lane adapter 132 and the USB port physical layer circuit 110. In this embodiment, the USB integrated circuit 100 operating in the working mode may execute at least one function to apply the at least one function to an electronic device coupled to the USB integrated circuit 100.

It is worth mentioning here that, even if the device to be tested (e.g., a programmable logic device) coupled to the USB integrated circuit 100 does not support the transmission standard of the USB4 V2 Gen4 specification, the USB integrated circuit 100 may format the differential signal conforming to the USB4 V2 Gen4 specification into a ternary digital signal through the USB port physical layer circuit 110, and the USB integrated circuit 100 may transmit formatted application specific data conforming to the USB4 V2 Gen4 specification through the lane adapter 131 to execute testing.

Figure 3:
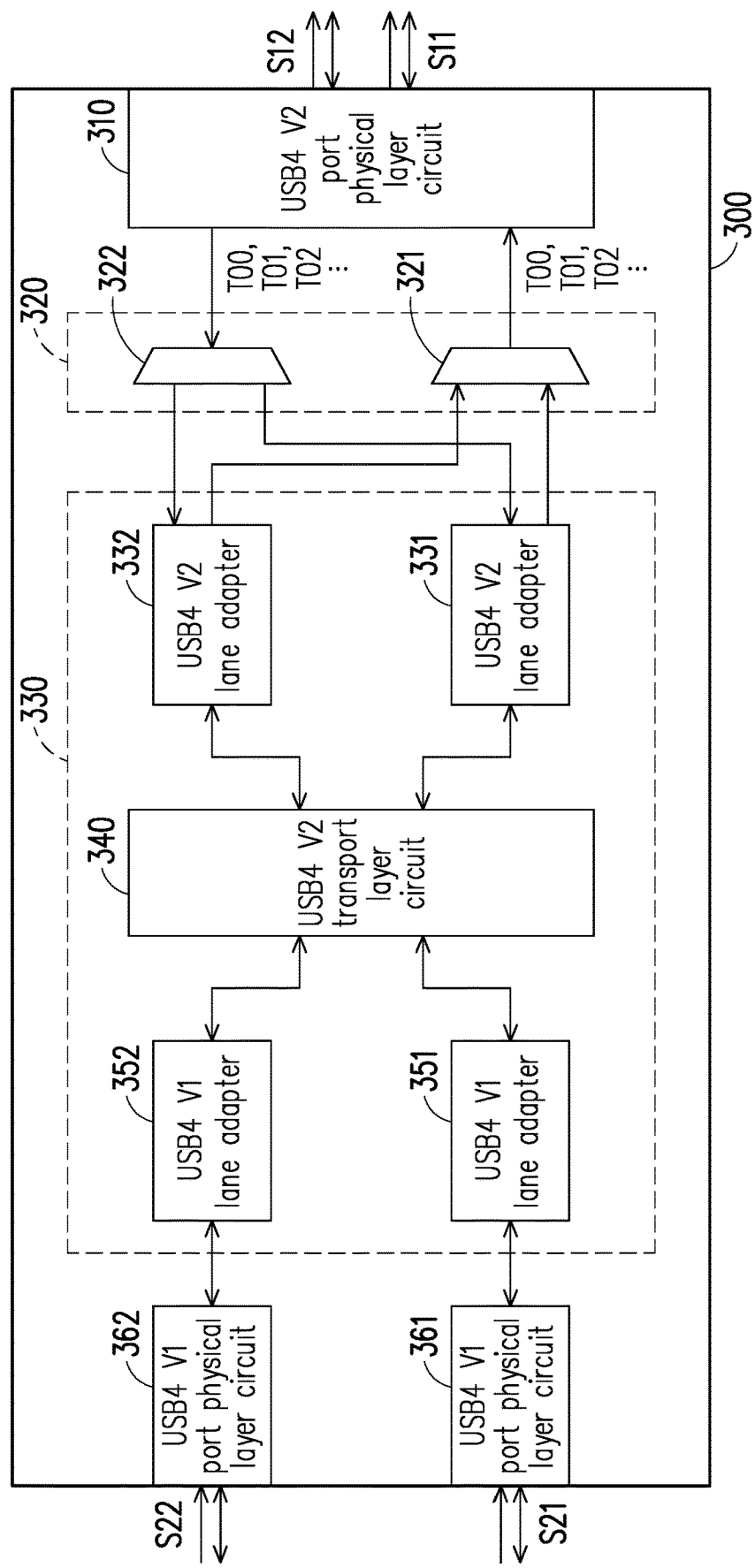
FIG. 3 is a circuit block schematic diagram of a USB integrated circuit according to another embodiment of the disclosure.

FIG. 3 is a circuit block schematic diagram of a USB integrated circuit according to another embodiment of the disclosure. Referring to FIG. 3, in this embodiment, the USB integrated circuit 300 shown in FIG. 3 may be deduced by referring to the related description of the USB integrated circuit 100 shown in FIG. 1.

The difference between the USB integrated circuit 300 of FIG. 3 and the USB integrated circuit 100 of FIG. 1 is that the USB integrated circuit 300 further includes USB4 V1 lane adapters 351 to 352 and USB4 V1 port physical layer circuits 361 to 362. On the other hand, for the convenience of describing the content of this disclosure, the USB port physical layer circuit 110 in FIG. 1 is renamed as the USB4 V2 port physical layer circuit 310 in FIG. 3, the lane adapters 131 to 132 in FIG. 1 are respectively renamed as USB4 V2 lane adapters 331 to 332 in FIG. 3, and the USB transport layer circuit 140 in FIG. 1 is renamed as USB4 V2 transport layer circuit 340 in FIG. 3.

In this embodiment, the routing circuit 320 of the USB integrated circuit 300 includes a multiplexer 321 and a demultiplexer 322. In this embodiment, the input end of the demultiplexer 322 is coupled to the output end of the USB4 V2 port physical layer circuit 310. The first output end of the demultiplexer 322 is coupled to the input end of the USB4 V2 lane adapter 331. The second output end of the demultiplexer 322 is coupled to the input end of the USB4 V2 lane adapter 332. In this embodiment, the output end of the multiplexer 321 is coupled to the input end of the USB4 V2 port physical layer circuit 310. The first input end of the multiplexer 321 is coupled to the output end of the USB4 V2 lane adapter 331. The second input end of the multiplexer 321 is coupled to the output end of the USB4 V2 lane adapter 332.

In this embodiment, when the USB integrated circuit 300 operates in the testing mode, the demultiplexer 322 is controlled by the processor (not shown in FIG. 3) of the USB integrated circuit 300 to couple the output end of the USB4 V2 port physical layer circuit 310 to the input end of the USB4 V2 lane adapter 331. On the other hand, when the USB integrated circuit 300 operates in the testing mode, the multiplexer 321 is also controlled by the processor to couple the input end of the USB4 V2 port physical layer circuit 310 to the output end of the USB4 V2 lane adapter 331. It should be noted that when the USB integrated circuit 300 operates in the testing mode, the USB4 V2 port physical layer circuit 310 may be selectively electrically connected to the USB4 V2 lane adapter 331 through the demultiplexer 322 and the multiplexer 321 to transmit application specific data for testing.

In this embodiment, when the USB integrated circuit 300 operates in the working mode, the demultiplexer 322 is controlled by the processor of the USB integrated circuit 300 to couple the output end of the USB4 V2 port physical layer circuit 310 to the input end of the USB4 V2 lane adapter 332. On the other hand, when the USB integrated circuit 300 operates in the working mode, the multiplexer 321 is also controlled by the processor to couple the input end of the USB4 V2 port physical layer circuit 310 to the output end of the USB4 V2 lane adapter 332. It should be noted that when the USB integrated circuit 300 operates in the working mode, the USB4 V2 port physical layer circuit 310 may be selectively electrically connected to the USB4 V2 lane adapter 332 through the demultiplexer 322 and the multiplexer 321 to transmit data for work.

In this embodiment, the USB4 V2 transport layer circuit 340 is coupled between the USB4 V2 lane adapters 331 to 332 and the USB4 V1 lane adapters 351 to 352. Specifically, the first input end of the USB4 V2 transport layer circuit 340 is coupled to the output end of the USB4 V2 lane adapter 331. The second input end of the USB4 V2 transport layer circuit 340 is coupled to the output end of the USB4 V2 lane adapter 332. On the other hand, the first output end of the USB4 V2 transport layer circuit 340 is coupled to the input end of the USB4 V1 lane adapter 351. The second output end of the USB4 V2 transport layer circuit 340 is coupled to the input end of the USB4 V1 lane adapter 352.

In this embodiment, when the USB integrated circuit 300 operates in the testing mode, the USB4 V2 transport layer circuit 340 is controlled by the processor of the USB integrated circuit 300 to couple the USB4 V2 lane adapter 331 to the USB4 V1 lane adapter 351 or 352. In this embodiment, when the USB integrated circuit 300 operates in the working mode, the USB4 V2 transport layer circuit 340 is controlled by the processor to couple the USB4 V2 lane adapter 332 to the USB4 V1 lane adapter 351 or 352.

In this embodiment, the USB4 V1 lane adapters 351 to 352 are also coupled to the USB4 V1 port physical layer circuits 361 to 362 in a one-to-one manner. Specifically, the output end of the USB4 V1 lane adapter 351 is coupled to the input end of the USB4 V1 port physical layer circuit 361. The output end of the USB4 V1 lane adapter 352 is coupled to the input end of the USB4 V1 port physical layer circuit 362.

In this embodiment, the USB4 V1 lane adapter 351 is a lane adapter conforming to the USB4 V1 specification. In the present embodiment, the USB4 V1 lane adapter 351 may be a standard specification adapter to process data conforming to the USB4 V1 specification transmitted between the USB4 V1 lane adapter 351 and the USB4 V2 transport layer circuit 340. The USB4 V1 lane adapter 352 may be deduced by referring to the related description of the USB4 V1 lane adapter 351, and therefore is not repeated herein.

In this embodiment, the USB integrated circuit 300 may also transmit the differential signals S21 to S22 between the USB integrated circuit 300 and another outside device (not shown in FIG. 3) through the USB4 V1 port physical layer circuits 361 to 362. In this embodiment, the USB4 V1 port physical layer circuit 361 may be compatible with another outside device of other specifications (e.g., the USB3 specification) earlier than the USB4 V1 specification. In this embodiment, the differential signals S21 to S22 conform to the USB4 V1 specification. In some embodiments, the differential signals S21 to S22 conform to the compatible USB3 specification. The USB4 V1 port physical layer circuit 362 may be deduced by referring to the related description of the USB4 V1 port physical layer circuit 361, and therefore is not repeated herein.

In this embodiment, the USB4 V2 lane adapters 331 to 332, the USB4 V2 transport layer circuit 340, and the USB4 V1 lane adapters 351 to 352 may be integrated into a data converter 330.

As shown in the various embodiments described above, when the USB integrated circuit 300 is operating in the testing mode, the data converter 330 may process application specific data conforming to the USB4 V2 specification through the USB4 V2 lane adapter 331, and distribute the application specific data to the USB4 V1 lane adapter 351 or 352 through the USB4 V2 transport layer circuit 340. Assuming that the USB4 V1 lane adapter 351 is selected, the data converter 330 may convert the application specific data into application specific data conforming to the USB4 V1 specification through the USB4 V1 lane adapter 351, in order to transmit to the USB4 V1 port physical layer circuit 361. The data converter 330 may also operate in reverse to convert the application specific data conforming to the USB4 V1 specification into application specific data conforming to the USB4 V2 specification, as deduced from the description above, and is not be repeated herein.

On the other hand, as shown in various embodiments described above, when the USB integrated circuit 300 operates in the working mode, the data converter 330 may also convert data between the USB4 V2 specification and the USB4 V1 specification through the USB4 V2 lane adapter 332 and the above-mentioned related elements, which may be deduced by referring to the related description of the data converter 330 and the USB4 V2 lane adapter 332, and therefore is not repeated herein.

Figure 4:
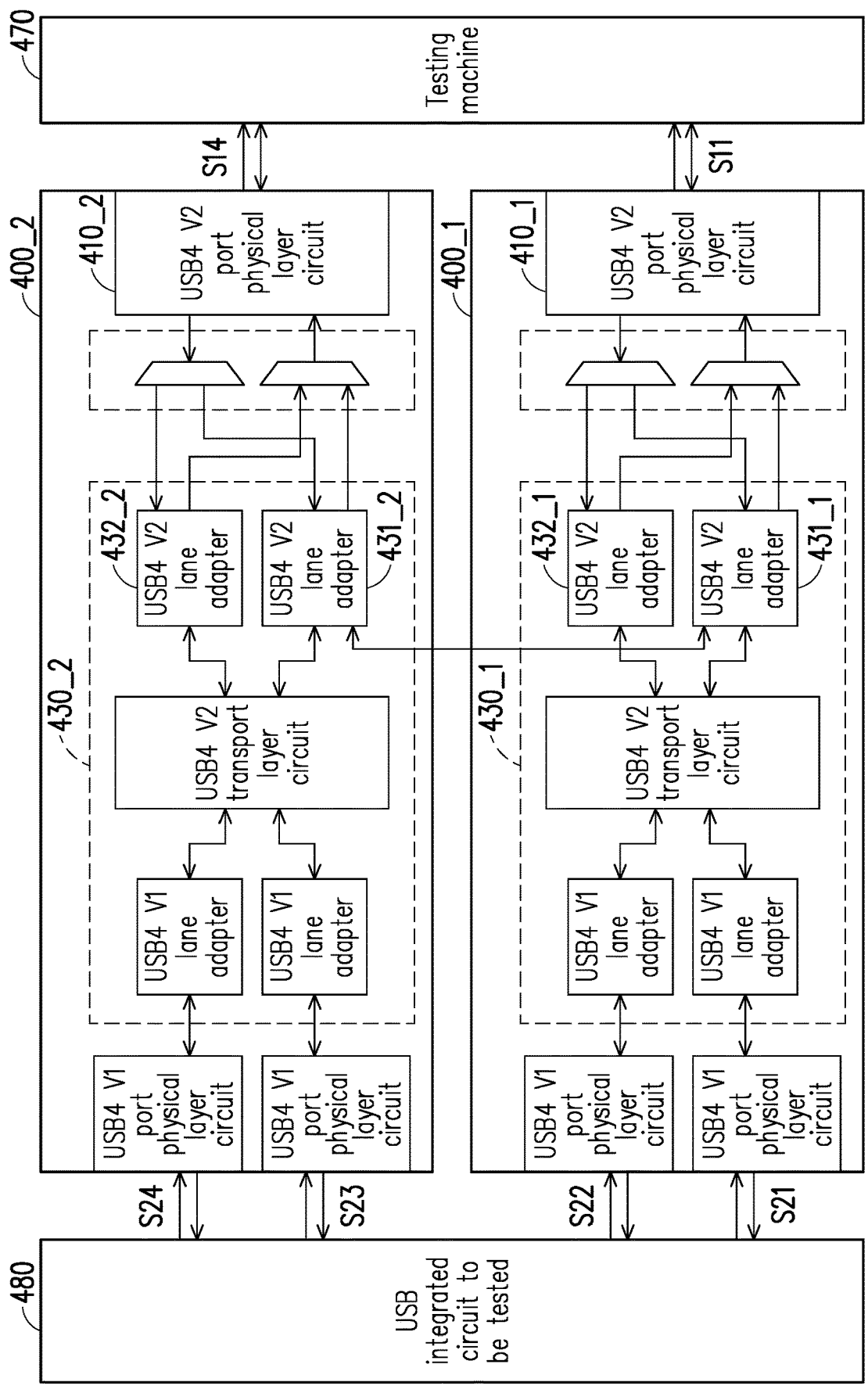
FIG. 4 is a circuit block of a USB integrated circuit according to another embodiment of the disclosure.

FIG. 4 is a circuit block of a USB integrated circuit according to another embodiment of the disclosure. Referring to FIG. 4, in this embodiment, the USB integrated circuits 400_1 and 400_2 are coupled to each other and have the same circuit configuration. The USB integrated circuit 400_1 or/and 400_2 shown in FIG. 4 may be deduced by referring to the related descriptions of the USB integrated circuit 100 shown in FIG. 1 and the USB integrated circuit 300 shown in FIG. 3. On the other hand, for the convenience of describing the content of the disclosure, some elements and/or element numbers of the USB integrated circuits 400_1 to 400_2 shown in FIG. 4 are omitted.

The difference between the USB integrated circuit 400_1 of FIG. 4 and the USB integrated circuit 300 of FIG. 3 is that when the USB integrated circuit 400_1 operates in the testing mode, since only the USB4 V2 lane adapter 431_1 is enabled, and the USB4 The V2 lane adapter 432_1 is disabled, the USB integrated circuit 400_1 may transmit a pair of differential signals S11 between the USB integrated circuit 400_1 and an outside device (i.e., the testing machine 470) through the USB4 V2 port physical layer circuit 410_1, without including another pair of differential signals S12. The USB integrated circuit 400_2 transmits another pair of differential signals S14 between the USB integrated circuit 400_1 and the testing machine 470 through the USB4 V2 port physical layer circuit 410_2.

In this embodiment, when the USB integrated circuit 400_1 operates in the testing mode, the USB4 V2 lane adapter 431_1 of the USB integrated circuit 400_1 is coupled to the USB4 V2 lane adapter 431_2 of the USB integrated circuit 400_2, and are controlled by the processors (not shown in FIG. 4) in the respective USB integrated circuits 400_1 to 400_2 to operate synchronously, as related to the description about the USB4 V2 lane adapter 331 in FIG. 3 and therefore is not repeated herein.

It should be noted that when the USB integrated circuit 400_1 operates in the testing mode, the USB integrated circuit 400_1 may process the differential signal S11 between the USB integrated circuit 400_1 and the testing machine 470 through the USB4 V2 port physical layer circuit 410_1. In addition, the USB integrated circuit 400_2 may also process the differential signal S14 between the USB integrated circuit 400_2 and the testing machine 470 through the USB4 V2 port physical layer circuit 410_2. On the other hand, when the USB integrated circuit 400_1 operates in the testing mode, the USB integrated circuit 400_1 may process the formatted differential signal S11 through the USB4 V2 lane adapter 431_1 of the data converter 430_1, and the USB integrated circuit 400_2 may also simultaneously process the formatted differential signal S14 through the USB4 V2 lane adapter 431_2 of the data converter 430_2.

In this way, in the testing mode, even if only one transmission lane is enabled between the data converter 430_1 and the USB4 V2 port physical layer circuit 410_1, by synchronously operating the two USB4 V2 lane adapters 431_1 to 431_2, the USB integrated circuits 400_1 to 400_2 may transmit four differential signals S21 to S24 conforming to the USB4 V1 specification between the USB integrated circuits 400_1 to 400_2 and another outside device (i.e., the USB integrated circuit to be tested 480).

Figure 5:
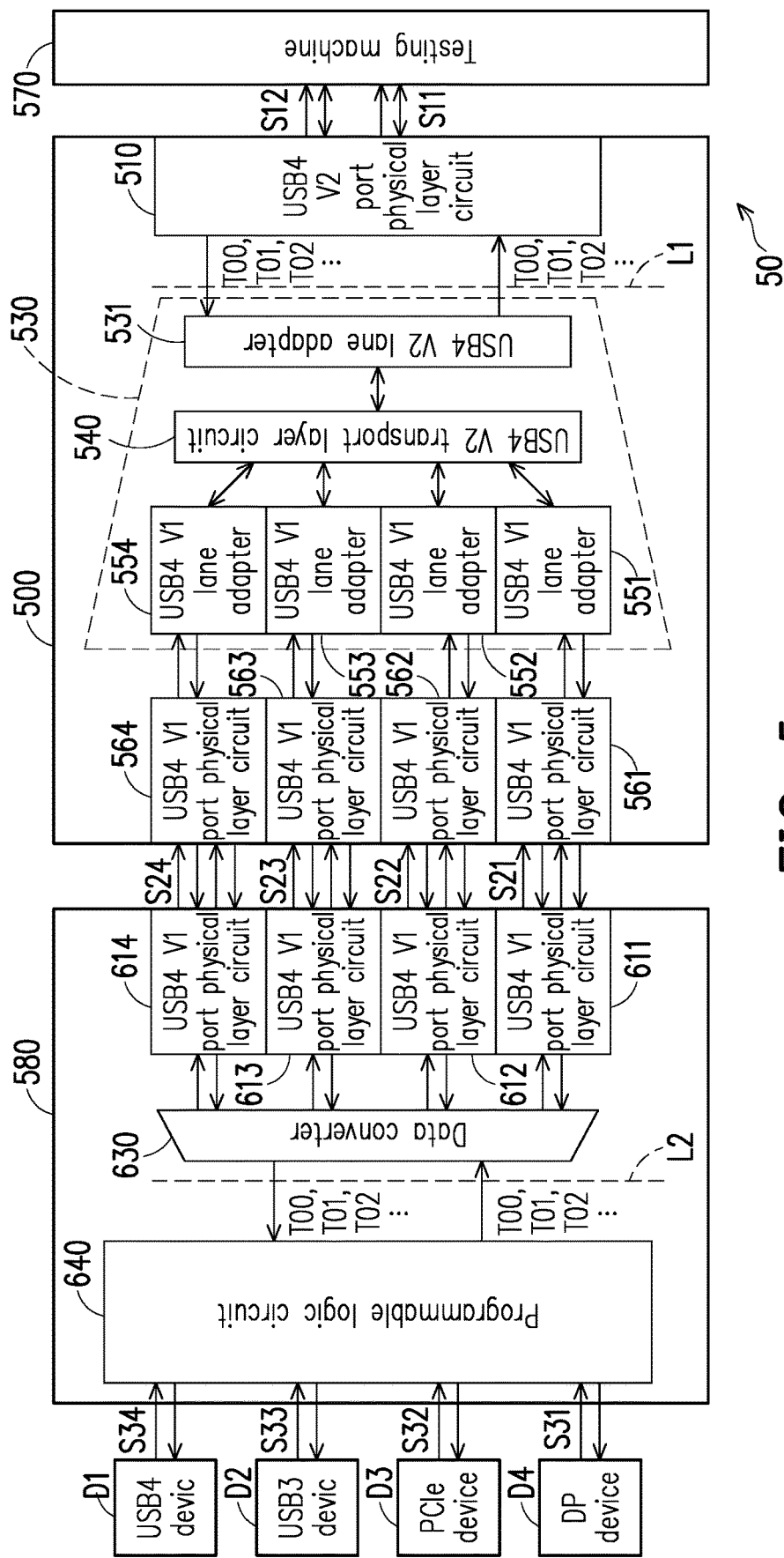
FIG. 5 is a circuit block schematic diagram of a testing platform according to an embodiment of the disclosure.

FIG. 5 is a circuit block schematic diagram of a testing platform according to an embodiment of the disclosure. Referring to FIG. 5, in this embodiment, the testing platform 50 includes a testing machine 570 and a USB integrated circuit 500, and the testing platform 50 may test the USB integrated circuit to be tested 580. In this embodiment, the testing machine 570 may be a USB host. The testing machine 570 may generate at least one test pattern. The test pattern may be a hardware description language (HDL). The test pattern may describe the function of the logic circuit, so that the USB integrated circuit to be tested 580 performs a specific operation according to the test pattern to test whether the function corresponding to the USB integrated circuit to be tested 580 is abnormal.

In this embodiment, the USB integrated circuit 500 is coupled between the testing machine 570 and the USB integrated circuit to be tested 580. Specifically, the input end of the USB integrated circuit 500 is coupled to the testing machine 570 to receive downstream signals S11 to S12. In this embodiment, the downstream signals S11 and/or S12 may be differential signals conforming to the USB4 V2 specification (e.g., PAM3 signals conforming to the USB4 V2 Gen4 specification), and include a test pattern. On the other hand, the output end of the USB integrated circuit 500 is coupled to the USB integrated circuit to be tested 580 to provide the downstream signals S21 to S24. In this embodiment, the downstream signals S21, S22, S23, and/or S24 may be differential signals conforming to the USB4 V1 specification (e.g., ternary signals conforming to the USB4 V1 specification), and include a test pattern. Therefore, the test pattern generated by the testing machine 570 is transmitted to the USB integrated circuit to be tested 580 through the USB integrated circuit 500.

In the present embodiment, the USB integrated circuit 500 shown in FIG. 5 may be deduced by referring to the related descriptions of the USB integrated circuit 100 shown in FIG. 1, the USB integrated circuit 300 shown in FIG. 3, and the USB integrated circuits 400_1 to 400_2 shown in FIG. 4. On the other hand, for the convenience of describing the content of the disclosure, some elements and/or element numbers of the USB integrated circuit 500 shown in FIG. 5 are omitted (e.g., the routing circuit is not shown in FIG. 5).

The difference between the USB integrated circuit 500 of FIG. 5 and the USB integrated circuit 300 of FIG. 3 is that the USB integrated circuit 500 further includes USB4 V1 lane adapters 553 to 554 and USB4 V1 port physical layer circuits 563 to 564, to add another two lanes to transmit another two downstream signals S23 to S24 between the USB integrated circuit 500 and another outside device (i.e., the USB integrated circuit to be tested 580). The USB4 V1 lane adapters 553 to 554 may be deduced by referring to the related description of the USB4 V1 lane adapter 351, and therefore is not repeated herein. The USB4 V1 port physical layer circuits 563 to 564 may be deduced by referring to the related description of the USB4 V1 port physical layer circuit 361, and therefore is not repeated herein.

It should be noted that, in this embodiment, the USB integrated circuit 500 may be a test-dedicated integrated circuit, so the USB integrated circuit 500 may only include the USB4 V2 lane adapter 531 and standard specification adapters (e.g., lane adapter 332 in FIG. 3) that conform to the USB4 V2 specification are omitted.

In this embodiment, the data converter 530 may package the ternary digital signals T00, T01, T02, . . . to reduce the delay in the transmission of the ternary digital signals T00, T01, T02, . . . within the USB integrated circuit 500 and/or between the USB integrated circuit 500 and the USB integrated circuit to be tested 580.

Figure 6:
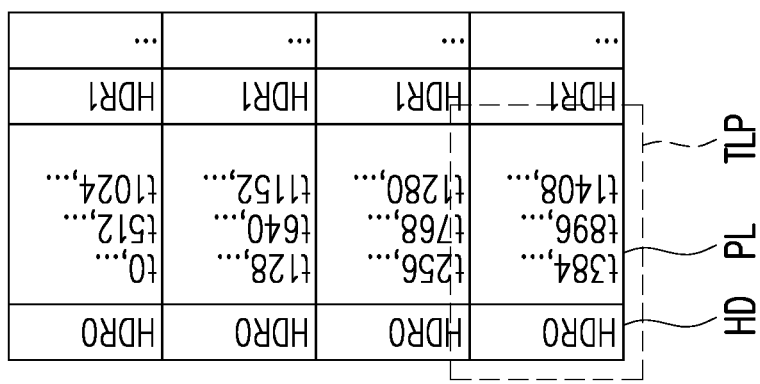
FIG. 6 is a schematic diagram of a transport layer package according to an embodiment of the disclosure.

Specifically, please also refer to FIG. 6. FIG. 6 is a schematic diagram of a transport layer package according to an embodiment of the disclosure. In this embodiment, the lane adapter 531 encapsulates the ternary digital signals T00, T01, T02, . . . into multiple transport layer packages TLP corresponding to the USB4 V1 lane adapters 551 to 554 in a one-to-one manner. In this embodiment, the header of each of the transport layer packages TLP includes batch information to indicate the addresses of the corresponding USB4 V1 lane adapters 551 to 554. The payload of each of the transport layer packages TLP includes multiple rows to carry corresponding data.

For example, the lane adapter 531 sequentially fills the first row of the rows of each of the transport layer packages TLP with the ternary digital signals t0 to t384. After the first rows are filled, the lane adapter 531 sequentially fills the second row of the rows of each of the transport layer packages TLP with the ternary digital signals t512 to t896, and so on.

In this embodiment, the lane adapter 531 transmits the packaged transport layer packages TLP to the USB4 V2 transport layer circuit 540. The USB4 V2 transport layer circuit 540 transmits each of the transport layer packages TLP to the corresponding USB4 V1 lane adapters 551 to 554 according to the header of each of the transport layer packages TLP. It should be noted that, in this embodiment, the USB4 V2 transport layer circuit 540 may align transport layer packages TLP with the same header, and transmit each of these transport layer packages TLP simultaneously and in a one-to-one manner to the USB4 V1 lane adapters 551 to 554. The lane adapters 131, 331, 431_1 and/or 431_2 of the various embodiments above may also implement the content of this embodiment, and therefore it is not repeated herein.

In this embodiment, the USB integrated circuit to be tested 580 may be a programmable logic device, such as a field programmable gate array (FPGA). In this embodiment, the USB integrated circuit to be tested 580 includes the USB4 V1 port physical layer circuits 611 to 614, a data converter 630, and a programmable logic circuit 640.

In this embodiment, the input end of the USB4 V1 port physical layer circuit 611 is coupled to the output end of the USB4 V1 port physical layer circuit 561. The output end of the USB4 V1 port physical layer circuit 611 is coupled to one of the multiple input ends of the data converter 630. In this embodiment, the USB4 V1 port physical layer circuit 611 is a port physical layer circuit conforming to the USB4 V1 specification. In this embodiment, the USB integrated circuit to be tested 580 may transmit the downstream signal S21 between the USB integrated circuit to be tested 580 and the USB integrated circuit 500 through the USB4 V1 port physical layer circuit 611. The USB4 V1 port physical layer circuit 611 may also transmit the downstream signal S21 to the data converter 630. The USB4 V1 port physical layer circuits 612 to 614 may be deduced by referring to the related description of the USB4 V1 port physical layer circuit 611, and therefore is not repeated herein.

In this embodiment, the data converter 630 is further coupled to the programmable logic circuit 640. The data converter 630 may unpackage (restore) the ternary digital signal T00, T01, T02, . . . packaged into the transport layer packet TLP, and transmit the unpackaged ternary digital signal T00, T01, T02, . . . to the programmable logic circuit 640. The data converter 630 and the data converter 530 operate in the reverse direction of each other, and may be deduced with reference to the related description of the data converter 530, therefore it is not repeated herein.

It should be noted that, as shown in the transmission path between lines L1 to L2 in FIG. 5, the testing platform 50 may transmit the ternary digital signal T00, T01, T02, . . . between the USB4 V2 port physical layer circuit 510 and the programmable logic circuit 640.

In this embodiment, the programmable logic circuit 640 is further coupled to multiple electronic devices D1 to D4. The electronic devices D1 to D4 are, for example, a USB4 device D1 compatible with the USB4 V1 specification and/or the USB4 V2 specification, a USB3 device D2 compatible with the USB3 specification, a PCIe device D3 compatible with the high-speed peripheral component interconnection (PCI Express, PCIe) specification, and a DP device D4 compatible with the displayport (DP) specification. The number and transmission specification of the electronic devices D1 to D4 in this embodiment are only examples, and are not limited thereto.

In this embodiment, the USB integrated circuit to be tested 580 may execute the required test operations according to the ternary digital signals T00, T01, T02, . . . through the programmable logic circuit 640. Therefore, the USB integrated circuit to be tested 580 may transmit differential signals S31 to S34 conforming to different transmission specifications between the programmable logic circuit 640 and the electronic devices D1 to D4, and the USB integrated circuit to be tested 580 may also send back the tested ternary digital signals T00, T01, T02, . . . to the testing machine 570 through the USB integrated circuit 500.

It should be noted that, in this embodiment, when the USB integrated circuit 500 is operating in the testing mode (e.g., the analog test), the testing machine 570 may determine whether the analog function of the USB integrated circuit to be tested 580 is abnormal according to the differential signals S21 to S24 (e.g., PAM3 signals or coded signals conforming to other transmission specifications) transmitted between the USB integrated circuit to be tested 580 and the electronic devices D1 to D4. On the other hand, when the USB integrated circuit 500 is operating in the testing mode (e.g., logic test), the testing machine 570 may also determine whether the logic function of the USB integrated circuit to be tested 580 is abnormal according to the ternary digital signals T00, T01, T02, . . . sent back from the USB integrated circuit to be tested 580.

To sum up, the USB integrated circuit, the testing platform, and the operating method of the USB integrated circuit according to the embodiments of the disclosure may transmit application-specific data conforming to the USB4 V2 Gen4 specification through the USB port physical layer circuit and the lane adapter to execute a test on the USB integrated circuit to be tested. In some embodiments, the USB integrated circuit, the testing platform, and the operating method of the USB integrated circuit may further package the ternary digital signal into multiple transport layer packages to reduce the delay of signal transmission.

Although the disclosure has been described in detail with reference to the above embodiments, they are not intended to limit the disclosure. Those skilled in the art should understand that it is possible to make changes and modifications without departing from the spirit and scope of the disclosure. Therefore, the protection scope of the disclosure shall be defined by the following claims.

What is claimed is:

1. A USB integrated circuit, comprising:
a first USB port physical layer circuit, configured to transmit a differential signal between the USB integrated circuit and an outside device;
a first lane adapter;
a second lane adapter;
a routing circuit, coupled to the first USB port physical layer circuit, the first lane adapter, and the second lane adapter, wherein when the USB integrated circuit operates in a testing mode, the routing circuit electrically connects the first lane adapter to the first USB port physical layer circuit, and when the USB integrated circuit operates in a working mode, the routing circuit electrically connects the second lane adapter to the first USB port physical layer circuit; and
a USB transport layer circuit, coupled to the first lane adapter and the second lane adapter.

2. The USB integrated circuit according to claim 1, wherein the first lane adapter is a vendor specific adapter conforming to the USB4 V2 specification, and the second lane adapter is a lane adapter conforming to the USB4 V2 specification.

3. The USB integrated circuit according to claim 1, further comprising:
a plurality of third lane adapters, coupled to the USB transport layer circuit; and
a plurality of second USB port physical layer circuit, coupled to the third lane adapters in a one-to-one manner.

4. The USB integrated circuit according to claim 1, wherein when the USB integrated circuit operates in the testing mode, the second lane adapter is disabled, and the first lane adapter is coupled to a third lane adapter to operate synchronously with the third lane adapter.

5. The USB integrated circuit according to claim 1, wherein the differential signal comprises a pulse-amplitude modulation signal having three level states, and the first USB port physical layer circuit is configured to convert the differential signal into a ternary digital signal.

6. The USB integrated circuit according to claim 1, further comprising:
a plurality of third lane adapters, coupled to the USB transport layer circuit, wherein the first USB port physical layer circuit is configured to convert a plurality of differential signals between the USB integrated circuit and the outside device into a plurality of ternary digital signals, the first lane adapter packages the ternary digital signals into a plurality of transport layer packages that correspond to the third lane adapters in a one-to-one manner, and the USB transport layer circuit transmits each of the transport layer packages to a corresponding third lane adapter of the third lane adapters.

7. The USB integrated circuit according to claim 6, wherein a header of the transport layer packages comprises batch information, a payload of the transport layer packages comprises a plurality of rows, the first lane adapter sequentially fills a first row of the rows of each of the transport layer packages with the ternary digital signals, and after the first rows are filled, the first lane adapter sequentially fills a second row of the rows of each of the transport layer packages with the ternary digital signals.

8. The USB integrated circuit according to claim 1, wherein the routing circuit comprises:
a demultiplexer, having an input end coupled to an output end of the first USB port physical layer circuit, wherein a first output end of the demultiplexer is coupled to an input end of the first lane adapter, a second output end of the demultiplexer is coupled to an input end of the second lane adapter, when the USB integrated circuit operates in the testing mode, the demultiplexer couples output end of the first USB port physical layer circuit to the input end of the first lane adapter, and when the USB integrated circuit operates in the working mode, the demultiplexer couples the output end of the first USB port physical layer circuit to the input end of the second lane adapter; and
a multiplexer, having an out end coupled to an input end of the first USB port physical layer circuit, wherein a first input end of the multiplexer is coupled to an output end of the first lane adapter, a second input end of the multiplexer is coupled to an output end of the second lane adapter, when the USB integrated circuit operates in the testing mode, the multiplexer couples input end of the first USB port physical layer circuit to the output end of the first lane adapter, and when the USB integrated circuit operates in the working mode, the multiplexer couples the input end of the first USB port physical layer circuit to the output end of the second lane adapter.

9. A testing platform, configured to test a USB integrated circuit to be tested, the testing platform comprising:
   a testing machine, configured to generate at least one test pattern; and
   a USB integrated circuit, coupled to the testing machine to receive a first downstream signal conforming to USB4 V2 specification, wherein the first downstream signal comprises the at least one test pattern, the testing machine is further coupled to the USB integrated circuit to be tested to provide a second downstream signal conforming to USB4 V1 specification, the at least one test pattern generated by the testing machine is transmitted to the USB integrated circuit to be tested through the USB integrated circuit, and the USB integrated circuit comprises:
      a first USB port physical layer circuit, configured to transmit a differential signal between the USB integrated circuit and the testing machine;
      a first lane adapter;
      a routing circuit, coupled to the first USB port physical layer circuit and the first lane adapter, wherein when the USB integrated circuit operates in a testing mode, the routing circuit electrically connects the first lane adapter to the first USB port physical layer circuit; and
      a USB transport layer circuit, coupled to the first lane adapter.

10. The testing platform according to claim 9, wherein the first lane adapter is a vendor specific adapter conforming to the USB4 V2 specification.

11. The testing platform according to claim 9, wherein the USB integrated circuit further comprises:
    a plurality of third lane adapters, coupled to the USB transport layer circuit; and
    a plurality of second USB port physical layer circuits, coupled to the third lane adapters in a one-to-one manner.

12. The testing platform according to claim 11, wherein the second USB port physical layer circuits are configured to be coupled to the USB integrated circuit to be tested.

13. The testing platform according to claim 9, wherein the first USB port physical layer circuit are configured to be coupled to the testing machine.

14. The testing platform according to claim 9, wherein the differential signal comprises a pulse-amplitude modulation signal having three level states, and the first USB port physical layer circuit is configured to convert the differential signal into a ternary digital signal.

15. The testing platform according to claim 9, wherein the USB integrated circuit further comprises a plurality of third lane adapters, the third lane adapters are coupled to the USB transport layer circuit, the first USB port physical layer circuit is configured to convert a plurality of differential signals between the USB integrated circuit and the testing machine into a plurality of ternary digital signals, the first lane adapter packages the ternary digital signals into a plurality of transport layer packages that correspond to the third lane adapters in a one-to-one manner, and the USB transport layer circuit transmits each of the transport layer packages to a corresponding third lane adapter of the third lane adapters.

16. The testing platform according to claim 15, wherein a header of the transport layer packages comprises batch information, a payload of the transport layer packages comprises a plurality of rows, the first lane adapter sequentially fills a first row of the rows of each of the transport layer packages with the ternary digital signals, and after the first rows are filled, the first lane adapter sequentially fills a second row of the rows of each of the transport layer packages with the ternary digital signals.

17. An operating method for a USB integrated circuit, comprising:
    transmitting a differential signal between the USB integrated circuit and an outside device through a first USB port physical layer circuit of the USB integrated circuit;
    when the USB integrated circuit operates in a testing mode, electrically connecting a first lane adapter of the USB integrated circuit to the first USB port physical layer circuit through a routing circuit of the USB integrated circuit, wherein the routing circuit is coupled to the first USB port physical layer circuit and the first lane adapter, and a USB transport layer circuit of the USB integrated circuit is coupled to the first lane adapter; and
    when the USB integrated circuit operates in a working mode, electrically connecting a second lane adapter of the USB integrated circuit to the first USB port physical layer circuit through the routing circuit, wherein the routing circuit and the USB transport layer circuit are coupled to the second lane adapter.

18. The operating method according to claim 17, wherein the first lane adapter is a vendor specific adapter conforming to the USB4 V2 specification, and the second lane adapter is a lane adapter conforming to the USB4 V2 specification.

19. The operating method according to claim 17, wherein the differential signal comprises a pulse-amplitude modulation signal having three level states, and the operating method further comprises:
    converting the differential signal into a ternary digital signal through the first USB port physical layer circuit.

20. The operating method according to claim 17, wherein the USB integrated circuit further comprises a plurality of third lane adapters, the third lane adapters are coupled to the USB transport layer circuit, and the operating method further comprises:
    converting a plurality of differential signals between the USB integrated circuit and the outside device into a plurality of ternary digital signals through the first USB port physical layer circuit;
    packaging the ternary digital signals into a plurality of transport layer packages that correspond to the third lane adapters in a one-to-one manner through the first lane adapter; and
    transmitting each of the transport layer packages to a corresponding third lane adapter of the third lane adapters through the USB transport layer circuit.

21. The operating method according to claim 20, wherein a header of the transport layer packages comprises batch information, a payload of the transport layer packages comprises a plurality of rows, and the operating method further comprises:
    sequentially filling a first row of the rows of each of the transport layer packages with the ternary digital signals through the first lane adapter; and
    after the first rows are filled, sequentially filling a second row of the rows of each of the transport layer packages with the ternary digital signals through the first lane adapter.

\* \* \* \* \*